(12) United States Patent
Ko et al.

(10) Patent No.: US 12,494,394 B2
(45) Date of Patent: Dec. 9, 2025

(54) APPARATUS AND METHOD OF MANUFACTURING DISPLAY APPARATUS

(71) Applicant: SAMSUNG DISPLAY CO., LTD., Yongin-si (KR)

(72) Inventors: Junhyeuk Ko, Yongin-si (KR); Euigyu Kim, Yongin-si (KR); Minseok Kim, Yongin-si (KR); Bongjun Kim, Yongin-si (KR); Haram Yoo, Yongin-si (KR); Kyunghoon Chung, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/213,726

(22) Filed: Mar. 26, 2021

(65) Prior Publication Data

US 2022/0006015 A1    Jan. 6, 2022

(30) Foreign Application Priority Data

Jul. 3, 2020    (KR) .................. 10-2020-0082263

(51) Int. Cl.
*H01L 21/683* (2006.01)
*H10K 71/16* (2023.01)

(52) U.S. Cl.
CPC ...... *H01L 21/6831* (2013.01); *H01L 21/6833* (2013.01); *H10K 71/166* (2023.02)

(58) Field of Classification Search
CPC ............ H01L 21/6831; H01L 21/6833; H01L 51/0011; H01L 51/56; H01L 21/687; H01L 21/68714; H01L 21/68721; H01L 21/68785; H01L 21/67; H01L 21/67005; H01L 21/67011; B05C 21/005; B05B 12/20; B05B 5/00; C23C 14/042; C23C 16/042; C23C 14/044; C23C 14/04; C23C 14/50; C23C 14/24; C23C 16/04; C23C 18/1605; C23C 18/1603; C23C 18/1601; H10K 71/166; H10K 71/16

See application file for complete search history.

(56) References Cited

U.S. PATENT DOCUMENTS 5,535,090 A * 7/1996 Sherman ............ H01L 21/6833
                                                            279/128
5,557,215 A * 9/1996 Saeki ................ H01L 21/6833
                                                            156/345.28

(Continued)

FOREIGN PATENT DOCUMENTS

KR    10-1058748      8/2011
KR    10-2012-0126354    11/2012

(Continued)

*Primary Examiner* — Sophia T Nguyen
(74) *Attorney, Agent, or Firm* — F. CHAU & ASSOCIATES, LLC

(57) ABSTRACT

An apparatus for manufacturing a display apparatus includes a substrate. A mask assembly includes an opening, a mask frame surrounding the opening, and at least one mask coupled to the mask frame. An electrostatic chuck is configured to attach the substrate to the at least one mask. A first driver is configured to drive the electrostatic chuck. At least a partial portion of the mask frame does not overlap the electrostatic chuck in a thickness direction of the substrate.

8 Claims, 10 Drawing Sheets

(56) References Cited

U.S. PATENT DOCUMENTS

| | | | | |
|---|---|---|---|---|
| 5,923,521 | A * | 7/1999 | Burkhart | H01L 21/6833 |
| | | | | 279/128 |
| 6,370,006 | B1 * | 4/2002 | Kumar | H01L 21/6833 |
| | | | | 361/234 |
| 6,529,362 | B2 * | 3/2003 | Herchen | H01L 21/6831 |
| | | | | 361/234 |
| 6,687,113 | B2 * | 2/2004 | Saito | H01L 21/6833 |
| | | | | 361/233 |
| 7,416,793 | B2 * | 8/2008 | Matsuda | H02N 13/00 |
| | | | | 501/153 |
| 7,646,581 | B2 * | 1/2010 | Sasaki | C23C 16/4586 |
| | | | | 361/234 |
| 7,782,593 | B2 * | 8/2010 | Bollman | H01L 21/6833 |
| | | | | 361/234 |
| 8,882,918 | B2 * | 11/2014 | Kawato | C23C 14/562 |
| | | | | 118/729 |
| 8,900,976 | B2 * | 12/2014 | Jin | C23C 14/50 |
| | | | | 117/103 |
| 9,234,270 | B2 | 1/2016 | Choi et al. | |
| 9,530,988 | B2 * | 12/2016 | Lee | H02N 13/00 |
| 9,534,288 | B2 * | 1/2017 | Choi | C23C 14/50 |
| 9,537,096 | B2 * | 1/2017 | Inoue | H10K 50/11 |
| 9,543,187 | B2 * | 1/2017 | Cooke | H01L 21/6833 |
| 9,765,428 | B2 | 9/2017 | Han | |
| 9,845,530 | B2 * | 12/2017 | Inoue | C23C 14/042 |
| 9,893,322 | B2 * | 2/2018 | Hahn | C23C 14/24 |
| 10,625,289 | B2 * | 4/2020 | Gong | B05B 12/20 |
| 10,675,711 | B2 * | 6/2020 | Han | B23K 37/0443 |
| 11,149,341 | B2 * | 10/2021 | Zhang | B05C 21/005 |
| 11,732,347 | B2 * | 8/2023 | Okamoto | C23C 14/54 |
| | | | | 118/712 |
| 11,807,933 | B2 * | 11/2023 | Cho | H10K 71/231 |
| 11,967,517 | B2 * | 4/2024 | Wang | H01L 21/67109 |
| 2001/0009139 | A1 * | 7/2001 | Shan | H01J 37/32165 |
| | | | | 156/345.43 |
| 2001/0046112 | A1 * | 11/2001 | Herchen | H02N 13/00 |
| | | | | 361/234 |
| 2001/0055190 | A1 * | 12/2001 | Saito | B23Q 3/154 |
| | | | | 279/128 |
| 2003/0101932 | A1 * | 6/2003 | Kang | H10K 71/00 |
| | | | | 118/504 |
| 2003/0106196 | A1 * | 6/2003 | Diaz | C23C 14/042 |
| | | | | 29/17.2 |
| 2003/0106647 | A1 * | 6/2003 | Koshiishi | C23C 16/4585 |
| | | | | 156/345.43 |
| 2003/0221614 | A1 * | 12/2003 | Kang | C23C 14/042 |
| | | | | 118/504 |
| 2004/0142108 | A1 * | 7/2004 | Atobe | C23C 14/24 |
| | | | | 118/721 |
| 2004/0261946 | A1 * | 12/2004 | Endoh | H01J 37/32642 |
| | | | | 156/345.1 |
| 2007/0061609 | A1 * | 3/2007 | Matsui | G03B 27/58 |
| | | | | 714/2 |
| 2007/0137571 | A1 * | 6/2007 | Kim | C23C 14/042 |
| | | | | 118/721 |
| 2007/0146679 | A1 * | 6/2007 | Sutedja | G03F 7/70991 |
| | | | | 355/72 |
| 2007/0217117 | A1 * | 9/2007 | Ohta | H01L 21/6833 |
| | | | | 361/234 |
| 2008/0062610 | A1 * | 3/2008 | Himori | H01L 21/6833 |
| | | | | 361/234 |
| 2008/0106842 | A1 * | 5/2008 | Ito | H01L 21/67028 |
| | | | | 118/723 R |
| 2010/0002355 | A1 * | 1/2010 | Morooka | H01L 21/67069 |
| | | | | 361/234 |
| 2011/0045617 | A1 * | 2/2011 | Kang | C23C 14/12 |
| | | | | 118/723 VE |
| 2011/0052791 | A1 * | 3/2011 | Jo | H01L 51/0011 |
| | | | | 427/256 |
| 2011/0052795 | A1 * | 3/2011 | Choi | C23C 14/50 |
| | | | | 118/721 |
| 2011/0067630 | A1 * | 3/2011 | Ko | C23C 14/042 |
| | | | | 118/721 |
| 2011/0141650 | A1 * | 6/2011 | Fujisawa | H01L 21/6732 |
| | | | | 361/234 |
| 2011/0149462 | A1 * | 6/2011 | Kugimoto | H01L 21/6831 |
| | | | | 252/520.5 |
| 2011/0239941 | A1 * | 10/2011 | Nakagawa | C23C 14/042 |
| | | | | 204/298.11 |
| 2012/0083061 | A1 * | 4/2012 | Kang | C23C 14/044 |
| | | | | 438/46 |
| 2012/0178190 | A1 * | 7/2012 | Krijne | C23C 14/50 |
| | | | | 427/292 |
| 2012/0237682 | A1 * | 9/2012 | Hong | C23C 14/042 |
| | | | | 118/712 |
| 2013/0009177 | A1 * | 1/2013 | Chang | B05B 13/0221 |
| | | | | 118/712 |
| 2013/0064969 | A1 * | 3/2013 | Inoue | C23F 1/02 |
| | | | | 118/504 |
| 2013/0133573 | A1 * | 5/2013 | Joo | C23C 14/042 |
| | | | | 118/504 |
| 2013/0205568 | A1 * | 8/2013 | Ko | B05C 11/00 |
| | | | | 29/458 |
| 2013/0321974 | A1 * | 12/2013 | Kuribayashi | H01L 21/67109 |
| | | | | 361/234 |
| 2014/0315343 | A1 * | 10/2014 | Kim | C23C 14/24 |
| | | | | 438/46 |
| 2014/0349428 | A1 * | 11/2014 | Han | H01L 51/56 |
| | | | | 438/34 |
| 2014/0356999 | A1 * | 12/2014 | Jang | H10K 71/164 |
| | | | | 438/34 |
| 2015/0044803 | A1 * | 2/2015 | Son | C23C 14/24 |
| | | | | 438/46 |
| 2015/0059974 | A1 * | 3/2015 | Boyd, Jr. | C23C 16/4581 |
| | | | | 427/124 |
| 2015/0114293 | A1 * | 4/2015 | Chung | C23C 16/042 |
| | | | | 118/721 |
| 2015/0259780 | A1 * | 9/2015 | Mizumura | C23C 14/042 |
| | | | | 427/555 |
| 2015/0295521 | A1 * | 10/2015 | Tatsumi | H02N 13/00 |
| | | | | 361/234 |
| 2016/0105971 | A1 * | 4/2016 | Han | B05B 13/0285 |
| | | | | 427/547 |
| 2016/0135252 | A1 * | 5/2016 | Matyushkin | H01L 21/6833 |
| | | | | 219/521 |
| 2016/0186305 | A1 * | 6/2016 | Han | H01L 51/0011 |
| | | | | 29/559 |
| 2016/0207066 | A1 * | 7/2016 | Han | B05C 21/005 |
| 2016/0233121 | A1 * | 8/2016 | Kim | B05D 3/0493 |
| 2016/0237546 | A1 * | 8/2016 | Ikenaga | C23F 1/00 |
| 2016/0296966 | A1 * | 10/2016 | Hong | H01L 51/0011 |
| 2016/0310988 | A1 * | 10/2016 | Lee | H10K 99/00 |
| 2016/0369389 | A1 * | 12/2016 | Ko | H01L 51/0011 |
| 2017/0032935 | A1 * | 2/2017 | Benjamin | H01L 21/67253 |
| 2017/0069844 | A1 | 3/2017 | Cho | |
| 2017/0076968 | A1 * | 3/2017 | Wang | H01L 21/6833 |
| 2017/0081758 | A1 * | 3/2017 | Inoue | H01L 51/50 |
| 2017/0104184 | A1 * | 4/2017 | Han | H10K 71/166 |
| 2017/0106472 | A1 * | 4/2017 | Han | C23C 14/042 |
| 2017/0107606 | A1 * | 4/2017 | Jinbo | C23C 14/5873 |
| 2017/0110661 | A1 * | 4/2017 | Lee | C23C 14/042 |
| 2017/0117474 | A1 * | 4/2017 | Kim | H01L 51/56 |
| 2017/0133592 | A1 * | 5/2017 | Baek | C23C 14/042 |
| 2017/0261867 | A1 * | 9/2017 | Kaller | G03F 7/70891 |
| 2017/0263867 | A1 * | 9/2017 | Kim | C23C 14/042 |
| 2017/0282212 | A1 * | 10/2017 | Kang | C23C 14/042 |
| 2017/0342543 | A1 * | 11/2017 | Ghosh | C23C 14/54 |
| 2017/0343901 | A1 * | 11/2017 | Ghosh | C23C 14/30 |
| 2018/0083192 | A1 * | 3/2018 | Jeong | H01L 21/67 |
| 2018/0087143 | A1 * | 3/2018 | Moon | C23C 14/042 |
| 2018/0198067 | A1 * | 7/2018 | Kim | H01L 51/0011 |
| 2018/0340252 | A1 * | 11/2018 | Vazan | C23C 16/4583 |
| 2019/0013229 | A1 * | 1/2019 | Cho | H01L 21/68764 |
| 2019/0019716 | A1 * | 1/2019 | Sasaki | H01L 21/6831 |
| 2019/0067578 | A1 * | 2/2019 | Kishimoto | B23K 26/22 |
| 2020/0013658 | A1 * | 1/2020 | Ko | H01L 21/67092 |
| 2020/0126837 | A1 * | 4/2020 | Kuno | B23Q 3/15 |
| 2020/0206765 | A1 * | 7/2020 | Gong | B23K 31/02 |

(56) References Cited

U.S. PATENT DOCUMENTS

| | | | | |
|---|---|---|---|---|
| 2020/0308688 A1* | 10/2020 | Ikenaga | .................... | C23F 1/00 |
| 2021/0005427 A1* | 1/2021 | Sawataishi | ........ | H01J 37/32082 |
| 2021/0005432 A1* | 1/2021 | Yamaguchi | ............ | H02N 13/00 |
| 2021/0006182 A1* | 1/2021 | Maeta | ............... | H01L 21/67109 |
| 2021/0074570 A1* | 3/2021 | Kugimoto | ........... | H01J 37/32642 |
| 2021/0308812 A1* | 10/2021 | Maeda | .............. | H01J 37/32715 |
| 2021/0348265 A1* | 11/2021 | Okamoto | ................ | C23C 14/54 |
| 2022/0148931 A1* | 5/2022 | Okabe | .................... | H01L 22/20 |
| 2022/0270907 A1* | 8/2022 | Boyd, Jr. | .............. | C23C 16/308 |
| 2023/0161242 A1* | 5/2023 | You | ........................... | G03F 1/64 |
| | | | | 430/5 |
| 2023/0250527 A1* | 8/2023 | Shimizu | ................... | G03F 1/84 |
| | | | | 118/720 |
| 2023/0416902 A1* | 12/2023 | Park | .................... | H10K 71/166 |

FOREIGN PATENT DOCUMENTS

| | | |
|---|---|---|
| KR | 10-2015-0077998 | 7/2015 |
| KR | 10-2015-0101910 A | 9/2015 |
| KR | 10-2016-0082410 | 7/2016 |
| KR | 10-1797927 B1 | 11/2017 |
| KR | 10-2018-0067231 | 6/2018 |
| KR | 20180067231 A * | 6/2018 |
| KR | 10-2018-0077172 | 7/2018 |
| WO | 2018-110953 | 6/2018 |

\* cited by examiner

APPARATUS AND METHOD OF MANUFACTURING DISPLAY APPARATUS

CROSS-REFERENCE TO RELATED APPLICATION

This application claims priority under 35 U.S.C. 119 to Korean Patent Application No. 10-2020-0082263, filed on Jul. 3, 2020, in the Korean Intellectual Property Office, the disclosure of which is incorporated by reference herein in its entirety.

1. TECHNICAL FIELD

One or more exemplary embodiments relate to an apparatus for manufacturing a display apparatus, and more particularly, to an apparatus for manufacturing a display apparatus in which a process yield increases.

2. DISCUSSION OF RELATED ART

As the information-oriented society develops, the demand for a display apparatus for displaying an image has increased. Flat-panel display (FPD) devices which are relatively thin and lightweight and which provide a relatively large display area have become increasingly popular. For example, FPD devices have replaced cathode ray tubes (CRT) which have a relatively large size as compared to FPD devices. FPD devices include liquid crystal display (LCD) devices, plasma display panels (PDPs), organic light-emitting display (OLED) devices, and electrophoretic display (ED) devices.

Organic light-emitting display apparatuses include an organic light-emitting diode that includes an opposite electrode, a pixel electrode, and an emission layer. The electrodes and the emission layers of the organic light-emitting display apparatuses may be formed through various methods. One of these methods includes an independent deposition method. The independent deposition method involves tensioning a fine metal mask (FMM) to closely attach the FMM to a mask frame and depositing a deposition material to a surface.

SUMMARY

One or more exemplary embodiments include an apparatus for manufacturing a display apparatus in which process loss is reduced, and a method of manufacturing a display apparatus.

Additional aspects will be set forth in part in the description which follows and, in part, will be apparent from the description, or may be learned by practice of the presented exemplary embodiments of the present inventive concepts.

According to an exemplary embodiment, an apparatus for manufacturing a display apparatus includes a substrate. A mask assembly includes an opening, a mask frame surrounding the opening, and at least one mask coupled to the mask frame. An electrostatic chuck is configured to attach the substrate to the at least one mask. A first driver is configured to drive the electrostatic chuck. At least a partial portion of the mask frame does not overlap the electrostatic chuck in a thickness direction of the substrate.

In a plan view, an inner end of the mask frame may be apart from an outer end of the electrostatic chuck.

The connection member may be coupled to at least a portion of a top surface of the electrostatic chuck to connect the electrostatic chuck to the first driver.

The first driver may transfer the electrostatic chuck upward or downward.

The apparatus may further include a first plate configured to closely attach the substrate to the mask.

The electrostatic chuck and the first plate may be independently driven.

The apparatus may further include a second driver configured to drive the first plate, wherein the second driver may transfer the first plate upward or downward.

The connection member may include a groove, and the first plate may be seated in the groove.

The connection member may include an opening that exposes at least a portion of a top surface of the electrostatic chuck, and the first plate may be seated in the opening.

The mask frame may include a first portion having a first thickness, and a second portion having a second thickness that is less than the first thickness, wherein the first portion may not overlap the electrostatic chuck.

According to an exemplary embodiment, an apparatus for manufacturing a display apparatus includes a substrate. A mask assembly includes an opening, a mask frame surrounding the opening, and at least one mask coupled to the mask frame. An electrostatic chuck is configured to attach the substrate to the mask. A first driver is configured to drive the electrostatic chuck. The electrostatic chuck includes a body portion that does not overlap the mask frame in a thickness direction of the substrate and has a first thickness and a connection portion that at least partially overlaps the mask frame in the thickness direction of the substrate and has a second thickness that is less than the first thickness.

The connection portion may at least partially surround the body portion.

In a plan view, an inner end of the mask frame may be apart from an outer end of the body portion of the electrostatic chuck.

The first driver may be coupled to a lateral surface of the electrostatic chuck to fix the electrostatic chuck.

The first driver may be coupled to the connection portion of the electrostatic chuck.

The first driver may transfer the electrostatic chuck upward or downward.

The apparatus may further include a first plate configured to closely attach the substrate to the mask.

The electrostatic chuck and the first plate may be independently driven.

The apparatus may further include a second driver configured to drive the first plate, wherein the second driver may transfer the first plate upward or downward.

According to one or more exemplary embodiments, a method of manufacturing a display apparatus includes forming a pixel electrode, forming an emission layer or an intermediate layer on the pixel electrode by using the apparatus for manufacturing a display apparatus in any of the claims, and forming an opposite electrode on the emission layer or the intermediate layer.

According to an exemplary embodiment, an apparatus for manufacturing a display apparatus includes a substrate. The mask assembly includes an opening, a mask frame surrounding the opening, and at least one mask coupled to the mask frame. An electrostatic chuck is configured to attach the substrate to the mask. The electrostatic chuck at least partially overlaps the opening in a thickness direction of the substrate to increase an adhesive force attaching the substrate to the at least one mask. These and/or other aspects will become apparent and more readily appreciated from the following description of exemplary embodiments, the accompanying drawings, and claims.

BRIEF DESCRIPTION OF THE DRAWINGS

The above and other aspects, features, and advantages of certain exemplary embodiments of the present inventive concepts will be more apparent from the following description taken in conjunction with the accompanying drawings, in which.

DETAILED DESCRIPTION OF EXEMPLARY EMBODIMENTS

Figure 1:
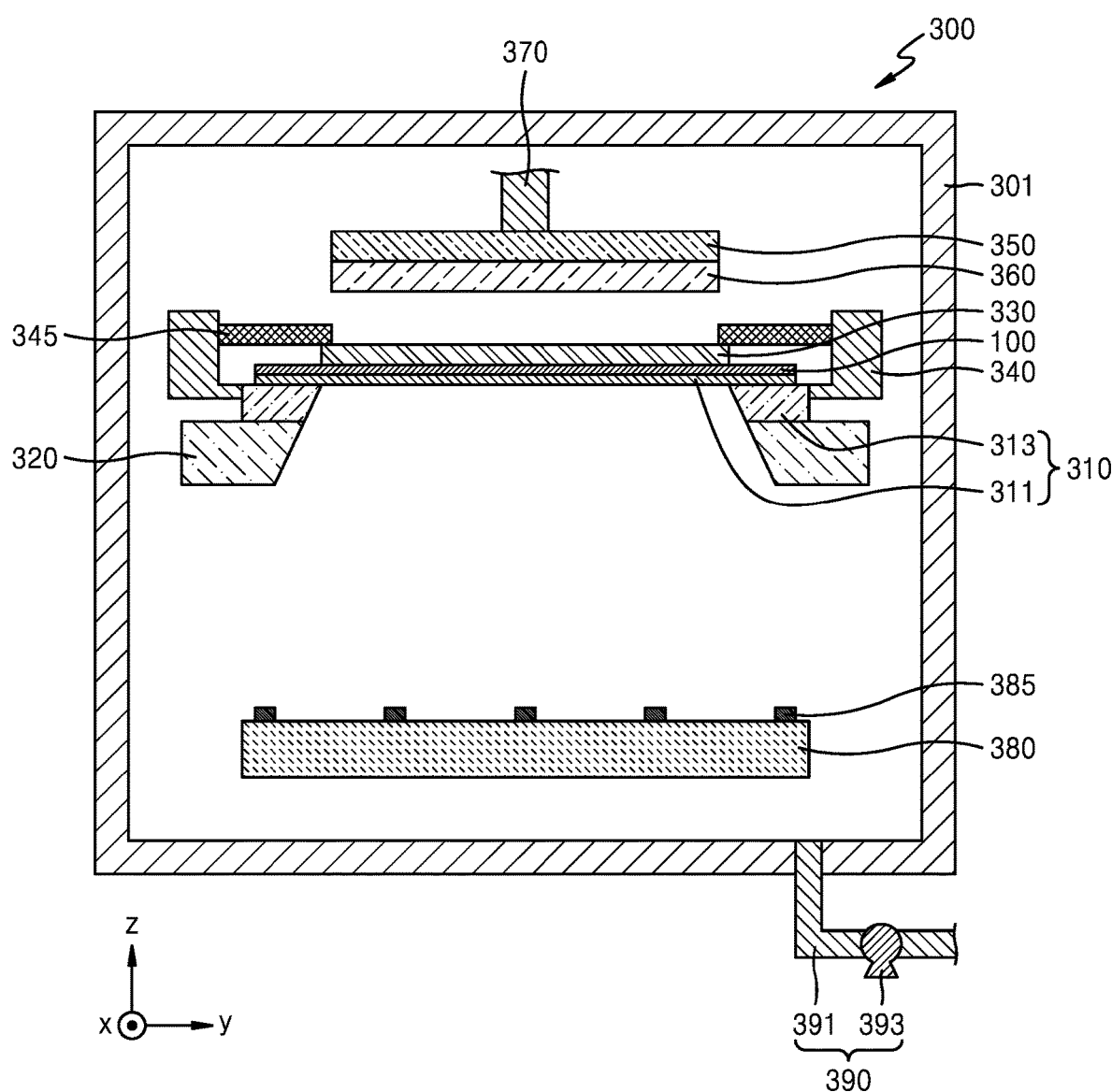
FIG. 1 is a cross-sectional view of an apparatus for manufacturing a display apparatus according to an exemplary embodiment of the present inventive concepts.

Reference will now be made in detail to exemplary embodiments of the present inventive concepts which are illustrated in the accompanying drawings, wherein like reference numerals refer to like elements throughout. In this regard, the present exemplary embodiments may have different forms and the present inventive concepts should not be construed as being limited to the exemplary embodiments set forth herein. Accordingly, exemplary embodiments are merely described below, by referring to the figures, to explain aspects of the present inventive concepts. As used herein, the term "and/or includes any and all combinations of" one or more of the associated listed items. Throughout the disclosure, the expression "at least one of a, b or c" indicates only a, only b, only c, both a and b, both a and c, both b and c, all of a, b, and c, or variations thereof.

Since the present inventive concepts may have diverse embodiments, exemplary embodiments are illustrated in the drawings and are described in the detailed description of exemplary embodiments. An effect and a characteristic of the present inventive concepts, and a method of accomplishing these will be apparent when referring to exemplary embodiments described with reference to the drawings. The present inventive concepts may, however, be embodied in many different forms and should not be construed as limited to the exemplary embodiments set forth herein.

It will be understood that although the terms "first," "second," etc. may be used herein to describe various components, these components should not be limited by these terms. These components are only used to distinguish one component from another.

An expression used in the singular encompasses the expression of the plural, unless it has a clearly different meaning in the context.

It be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, area, or element, it can be directly or indirectly formed on the other layer, region, or element. For example, intervening layers, regions, or elements may be present. However, when a layer, region, or element is referred to as being "formed directly on" another layer, area, or element, no intervening layers, regions, or elements may be present.

Sizes of elements in the drawings may be exaggerated for convenience of explanation. Therefore, since sizes and thicknesses of components in the drawings are arbitrarily illustrated for convenience of explanation, the following exemplary embodiments are not limited thereto.

In the present specification, "A and/or B" means A or B, or A and B. In the present specification, "at least one of A and B" means A or B, or A and B.

As used herein, when a wiring is referred to as "extending in a first direction or a second direction", it means that the wiring not only extends in a straight line shape but also extends in a zigzag or in a curve in the first direction or the second direction.

As used herein, "on a plan view" means viewed from above, and "on a cross-sectional view" means that a cross-section taken vertically is viewed from a lateral side. As used herein, "overlapping" includes overlapping "in a plan view" and "in a cross-sectional view."

Hereinafter, exemplary embodiments will be described in detail with reference to the accompanying drawings. The same reference numerals are used to denote the same elements.

FIG. 1 is a cross-sectional view of an apparatus 300 for manufacturing a display apparatus, according to an exemplary embodiment of the present inventive concepts.

Referring to the exemplary embodiment of FIG. 1, the apparatus 300 for manufacturing a display apparatus may include a chamber 301, a mask assembly 310 a support member 320, an electrostatic chuck 130, a first driver 340, a first plate 350, and a second driver 370.

The chamber 301 may define a space therein. In an exemplary embodiment, the chamber 301 may be formed such that a portion thereof is open in this exemplary embodiment, a gate valve, etc. may be arranged to open/close the open portion of the chamber 301.

The apparatus 300 for manufacturing a display apparatus according to an exemplary embodiment may include the support member 320. The support member 320 may support the mask assembly 310. For example, the support member 320 may fix the mask assembly 310. For example, as shown in the exemplary embodiment of FIG. 1, a lower surface of the mask assembly 310 may be disposed directly on an upper surface of the support member 320, However, exemplary embodiments of the present inventive concepts are not limited thereto. In addition, the support member 320 may raise/lower the mask assembly 310, such as in a predetermined distance range or rotate the mask assembly 310, such as in a predetermined angle range. Furthermore, the support member 320 may linearly move the mask assembly 310 in various directions, such as in a predetermined distance range.

The mask assembly 310 may include a mask 311, a mask frame 313 and an opening. The mask frame 313 may surround the opening through which a deposition material may pass and may include a plurality of frames surrounding the opening.

In an exemplary embodiment, the mask frame 313 may further include a support stick. The support stick may prevent sagging of the mask 311 due to the weight of the mask 311 and may support the mask frame 313.

The mask 311 may be disposed on the mask frame 313. For example, as shown in the exemplary embodiment of FIG. 1, a lower surface of the mask 311 may directly contact an upper surface of the mask frame 313. However, exemplary embodiments of the present inventive concepts are not limited thereto. In an exemplary embodiment, one mask 311 may be disposed on the mask frame 313 or a plurality of masks 311 may be disposed on the mask frame 313. In an exemplary embodiment in which a plurality of masks 311 are disposed on the mask frame 313, the plurality of masks 311 may be arranged in one direction to shield (e.g., cover) the opening surrounding the mask frame 313, Hereinafter, for convenience of description, an exemplary embodiment in which one mask 311 is provided and disposed on the mask frame 313 to shield the opening that the mask frame 313 surrounds is described in detail. The mask 311 may include at least one opening. In an exemplary embodiment in which a plurality of openings are provided, the plurality of openings may be arranged to form a pattern in a region of the mask 311. In addition, in an exemplary embodiment in which the plurality of openings are provided, the plurality of openings may be arranged in a plurality of regions of the mask 311 such that the plurality of openings are discriminated and arranged to form a pattern in each region.

The substrate 100, on which a deposition material is deposited, may be disposed on the mask assembly 310. For example, as shown in the exemplary embodiment of FIG. 1, a lower surface of the substrate 100 may directly contact an upper surface of the mask 311. However, exemplary embodiments of the present inventive concepts are not limited thereto. The electrostatic chuck 330 may be disposed on the substrate 100. For example, as shown in the exemplary embodiment of FIG. 1 a lower surface of the electrostatic chuck 330 may directly contact an upper surface of the substrate 100. However, exemplary embodiments of the present inventive concepts are not limited thereto. The electrostatic chunk 330 may fix the substrate 100 by using electrostatic force and may closely attach the substrate 100 to the mask 311, such as by attaching the substrate 100 securely to the mask 311 and with minimal or substantially no space (e.g., in the Z direction) therebetween. The electrostatic chuck 330 may be coupled to the substrate 100 to align the substrate 100 and prevent the substrate 100 from moving while a deposition material is deposited thereon. In addition, a gas filling positioned between the electrostatic chuck 330 and the substrate 100 may be prevented from leaking to the outside and the substrate 100 may be prevented from being moved (e.g., floated, etc.) due to the gas.

The first driver 340 may drive the electrostatic chuck 330. As shown in the exemplary embodiment of FIG. 1, the first driver 340 may be connected to the electrostatic chuck 330 through a connection member 345 to drive the electrostatic chuck 330. The first driver 340 may move the electrostatic chuck 330 upward or downward (e.g., in the Z direction). In addition, the first driver 340 may rotate the electrostatic chuck 330, such as in a predetermined angle range and linearly move the electrostatic chuck 330 in various directions, such as in a predetermined distance range. In an exemplary embodiment, the first driver 340 may include art apparatus or a structure such as a motor or a cylinder.

The first plate 350 may overlap the electrostatic chuck 330 (e.g., in the Z direction), in an exemplary embodiment, the first plate 350 may include a yoke plate and a magnet. Since the first plate 350 including, the yoke plate and the magnet is arranged to overlap the electrostatic chuck 330, the substrate 100 may be closely attached to the mask 311 doe to magnetic force provided by the first plate 350 as well as electrostatic force provided by the electrostatic chuck 330. Since the mask 311 may include metal, the mask 311 is pulled by magnetic force using the first plate 350 and the sagging of the substrate 100 and the mask 311 may be prevented.

The apparatus 300 for manufacturing a display apparatus according to an exemplary embodiment may further include a second plate 360 disposed between the substrate 100 and the first plate 350 (e.g. in the Z direction). The second plate 360 may be disposed between the substrate 100 and the first plate 350 to press the substrate 100 with its own weight. As an example, before the first plate 350 moves toward the substrate 100 and applies magnetic force to the mask 311, the second plate 360 may increase the adhesive force between the substrate 100 and the mask 311 by the exertion of pressure on the electrostatic chuck 330 and the substrate 100 due to its weight.

The second driver 370 may drive the first plate 350 and the second plate 360, The second driver 370 may move the first plate 350 and the second plate 360 upward or downward (e.g., in the Z direction). In addition, the second driver 370 may rotate the first plate 350 and the second plate 360, such as in a predetermined angle range and linearly move the first plate 350 and the second plate 360 in various directions, such as in a predetermined distance range. As an example, the second driver 370 may include an apparatus or a structure such as a motor or a cylinder.

In an exemplary embodiment, the electrostatic chuck. 330 and the first plate 350 may be driven independently from each other. In an exemplary embodiment, since the electrostatic chuck 330 is driven by the first driver 340, and the first plate 350 is driven by the second driver 370, the electrostatic chuck 330 and the first plate 350 may be driven independently from each other. Since the electrostatic chuck 330 and the first plate 350 are driven independently from each other by different drivers, alignment may be prevented from being distorted due to vibration and thus production capacity may be increased.

The apparatus 300 for manufacturing a display apparatus according to an exemplary embodiment may further include a deposition source 380. The deposition source 380 may be disposed inside the chamber 30. For example, as shown in the exemplary embodiment of FIG. 1, the deposition source 380 may be disposed on a lower portion of the chamber 301 (e.g., in the Z direction) and may face a lower surface of the mask 311. However, exemplary embodiments of the present inventive concepts are not limited thereto. A deposition material may be received inside the deposition source 380, In an exemplary embodiment, the deposition source 380 may include a heater that heats the deposition material.

A nozzle portion 385 may be connected, to the deposition source 380 to guide the deposition material evaporated or sublimated from the deposition source 380 towards the mask 311 and substrate 100. In an exemplary embodiment, the nozzle portion 385 may include at least one nozzle. In an exemplary embodiment in which the nozzle portion 385 includes a plurality of nozzles, the nozzles may be spaced apart from each other and may include dot nozzle forms arranged in a dot shape. In another exemplary embodiment, the nozzle may include to line type that sprays the deposition material into a predetermined region.

As shown in the exemplary embodiment of FIG. 1, a pressure adjustor 390 may be connected to the chamber 301 to adjust the inner pressure of the chamber 301. In this exemplary embodiment, the pressure adjustor 390 may include a connection pipe 391 and a pump 393. The connection pipe 391 is connected to the chamber 301, and the pump 393 is disposed on the connection pipe 391. In an exemplary embodiment, the connection pipe 391 may be connected to a separate apparatus that may remove external contaminated materials.

Figure 2:
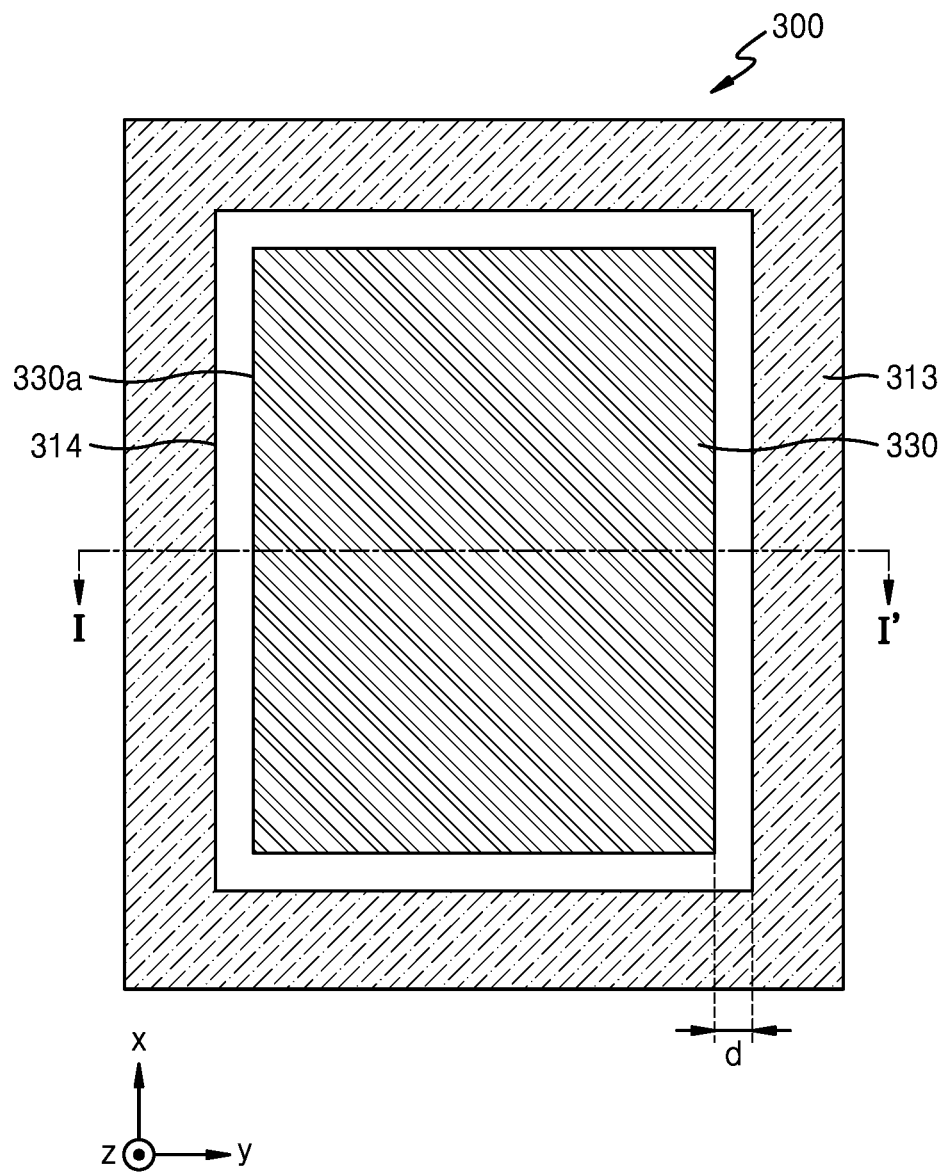
FIG. 2 is a plan view of an apparatus for manufacturing a display apparatus according to an exemplary embodiment of the present inventive concepts.
Figure 3:
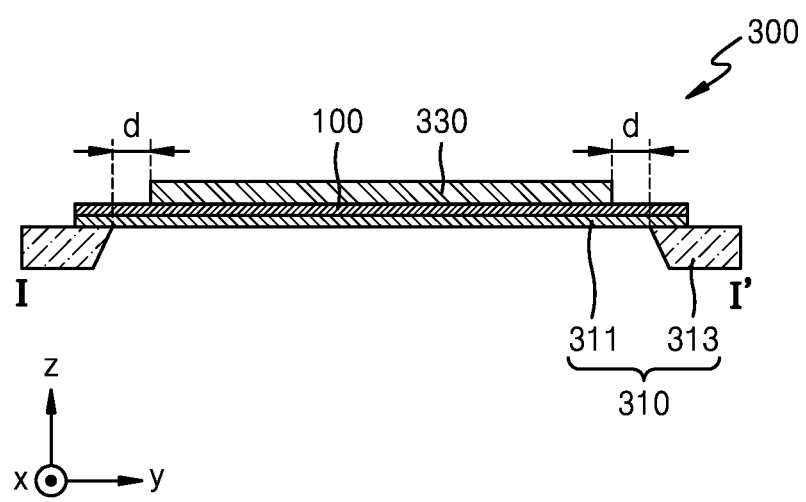
FIG. 3 is a cross-sectional view of an apparatus for manufacturing a display apparatus taken along line I-I' of FIG. 2 according to an exemplary embodiment of the present inventive concepts.

FIG. 2 is a plan view of the apparatus for manufacturing a display apparatus according to an exemplary embodiment of the present inventive concepts, and FIG. 3 is a cross-sectional view of the apparatus for manufacturing a display apparatus according to an exemplary embodiment of the present inventive concepts. FIG. 3 corresponds to a cross-sectional view of the apparatus for manufacturing a display apparatus, taken along line of FIG. 2. In FIGS. 2 and 3, for convenience of description, only the substrate 100, the mask assembly 310, and the electrostatic chuck 330 are shown. In addition, in FIGS. 2 and 3, the same reference numerals as those of FIG. 1 denote the same members, and thus, repeated descriptions of substantially identical elements are omitted for convenience of explanation.

Referring to FIGS. 2 and 3, in the apparatus 300 for manufacturing a display apparatus according to an exemplary embodiment, in a plan view (e.g., in a plane defined in the X and Y directions), an inner end 314 of the mask frame 313 may be spaced apart from an outer end 330a of the electrostatic chuck 330 by a predetermined distance d. For example, inner lateral edges of the mask frame 313 (e.g., inner lateral edges in the X and Y directions) may be spaced apart from outer lateral edges of the mask frame (e.g., outer lateral edges in the X and Y directions). As shown in the exemplary embodiment of FIG. 2, d may be a length in the Y direction between an outer end 330a of the electrostatic chuck 330 (e.g., an outer lateral edge of the electrostatic chuck 330 in the Y direction) and an inner end 314 of the mask frame (e.g., an inner lateral edge of the mask frame 313 in the Y direction). Accordingly the mask frame 313 may not overlap the electrostatic chuck 330 in an thickness direction of the substrate 100 (e.g. in the Z direction), For example, the electrostatic chuck 330 may overlap the opening in the mask assembly (e.g., in the Z direction). Since the mask frame 313 does not overlap the electrostatic chuck 330, the adhesive force between the mask 311 and the substrate 100 may be increased. Accordingly, PPA spread and yield may be increased, a shadow or icicle defect may be removed, and the flatness of the substrate 100 may be increased.

Figure 4:
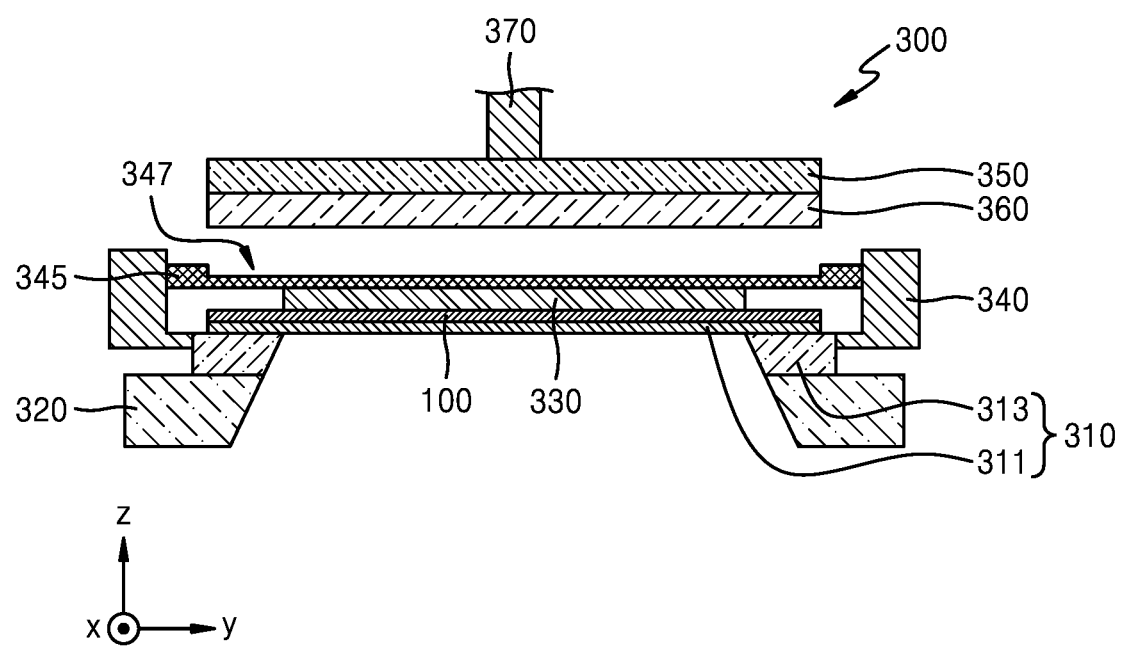
FIG. 4 is a cross-sectional view of an apparatus for manufacturing a display apparatus according to an exemplary embodiment of the present inventive concepts.

FIG. 4 is a cross-sectional view of the apparatus for manufacturing a display apparatus according to an exemplary embodiment of the present inventive concepts. FIG. 4 is a view for explaining the structure of a connection member 345 connecting the electrostatic chuck 330 to the first driver 340. In FIG. 4, for convenience of description, only the substrate 100, the mask assembly 310, the support member 320, the electrostatic chuck 330, die first driver 340, the connection member 345, the first plate 350, the second plate 360, and the second driver 370 are shown. In addition, in FIG. 4, the same reference numerals as those of FIG. 1 denote the same members, and thus, repeated descriptions of substantially identical elements are omitted for convenience of explanation.

Referring to FIG. 4, the apparatus 300 for manufacturing a display apparatus according to an exemplary embodiment of the present inventive concepts may include the connection member 345 connecting the electrostatic chuck 330 to the first driver 340. As shown in the exemplary embodiment of FIG. 4, the connection member 345 may be coupled to the top surface of the electrostatic chuck 330 to connect the electrostatic chuck 330 to the first driver 340. For example, a lower surface of the connection member 345 may directly contact an upper surface of the electrostatic chuck 330. However, exemplary embodiments of the present inventive concepts are not limited thereto.

As shown in the exemplary embodiment of FIG. 4, the connection member 345 may be coupled to the top surface of the electrostatic chuck 330 without exposing the top surface of the electrostatic chuck 330. For example, an entire top surface of the electrostatic chuck 330 may be covered by the connection member 345. The connection member 345 may include a groove 347 in which the first plate 350 is seated. The first plate 350 may be seated in the groove 347 of the connection member 345 to closely attach the substrate 100 to the mask 311. In an exemplary embodiment, the dimensions of the groove 347 may be substantially the same dimensions as those of the first plate 350. However, exemplary embodiments of the present inventive concepts are not limited thereto.

Figure 5:
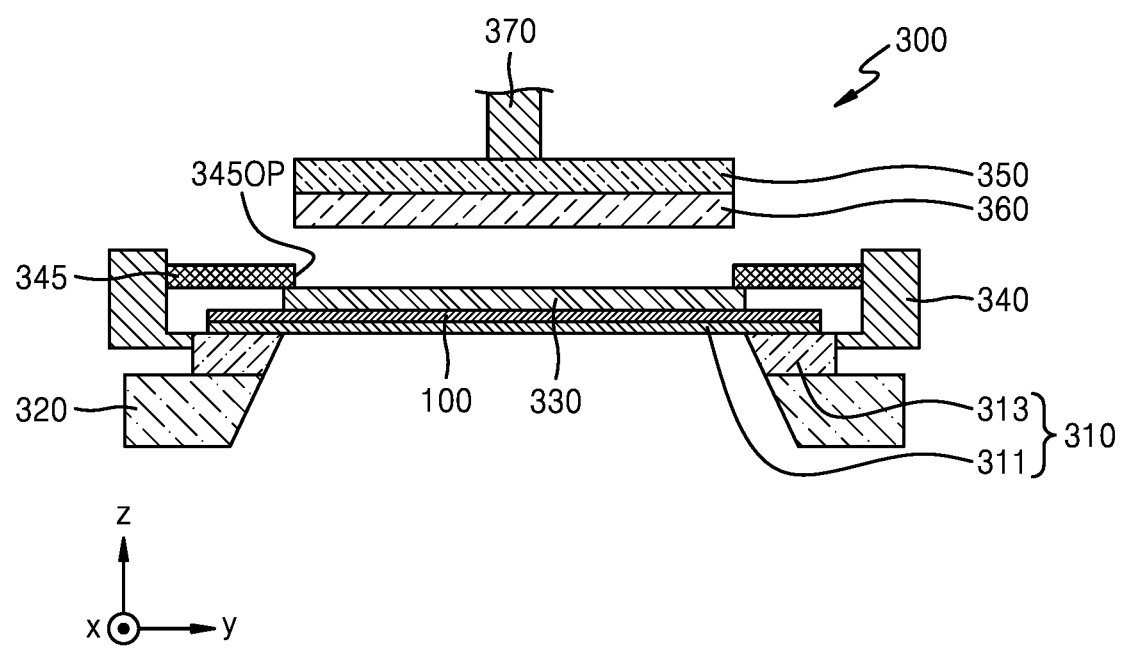
FIG. 5 is a cross-sectional view of an apparatus for manufacturing a display apparatus according to an exemplary embodiment of the present inventive concepts.

FIG. 5 is a cross-sectional view of the apparatus for manufacturing a display apparatus according to another exemplary embodiment of the present inventive concepts. FIG. 5 is a view for explaining the structure of the connection member 345 connecting the electrostatic, chuck 330 to the first driver 340. In FIG. 5, for convenience of description, only the substrate 100, the mask assembly 310, the support member 320, the electrostatic chuck 330, the first driver 340, the connection member 345, the first plate 350, the second plate 360, and the second driver 370 are shown. In addition, in FIG. 5, the same reference numerals as those of FIG. 1 denote the same members, and thus, repeated descriptions of substantially identical elements are omitted for convenience of explanation.

Referring to FIG. 5, the apparatus 300 for manufacturing a display apparatus according to an exemplary embodiment may include the connection member 345 connecting the electrostatic chuck 330 to the first driver 340. The connection member 345 may be coupled to a partial portion of the top surface of the electrostatic chuck 330 to connect the electrostatic chuck 330 to the first driver 340.

As shown in the exemplary embodiment of FIG. 5, the connection member 345 may be coupled to a partial portion of the top surface of the electrostatic chuck 330. For example, as shown in the exemplary embodiment of FIG. 5, the connection member 345 may be disposed directly on a top surface of lateral ends of the electrostatic chuck. The connection member 345 in the exemplary embodiment of FIG. 5 may include an opening (e.g., a hole) 3450P exposing at least a partial portion of the top surface of the electrostatic chuck 330 instead of the groove 347 as shown in the exemplary embodiment of FIG. 4 which covers an entire portion of the of op surface of the electrostatic chuck 330. The first plate 350 may be seated in the opening (e.g., a hole) 3450P defined in the connection member 345. In an exemplary embodiment, the dimensions of the opening 3450P may be substantially the same as those of the first plate 350. The first plate 350 may be seated in the opening 3450P of the connection member 345 to closely attach the substrate 100 to the mask 311.

Figure 6:
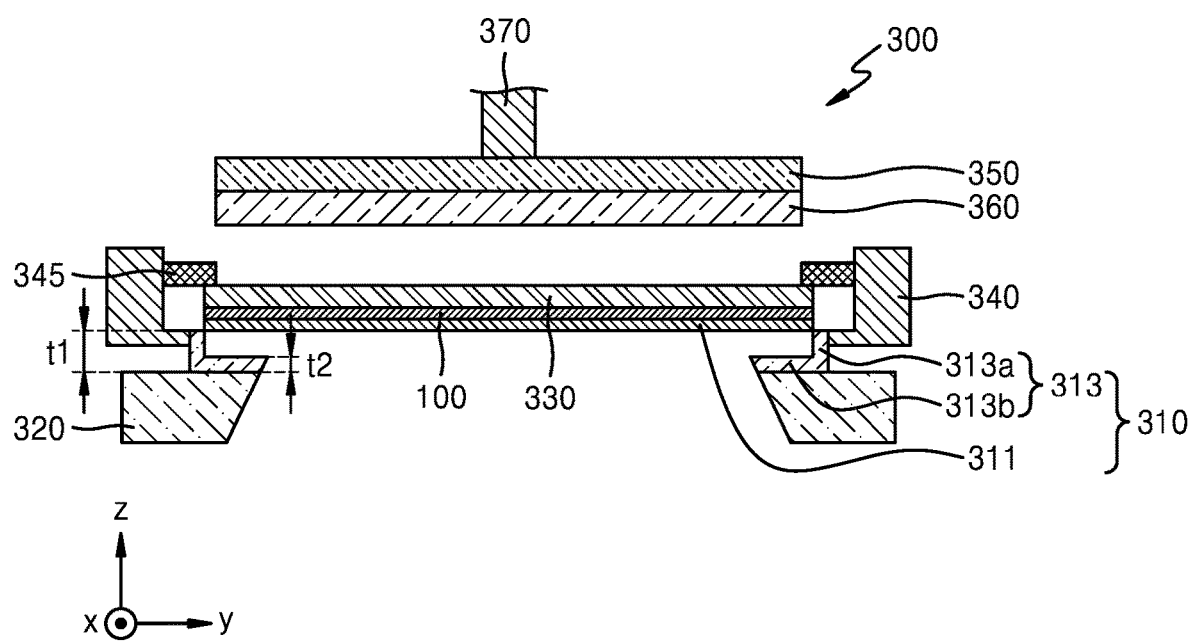
FIG. 6 is a cross-sectional view of an apparatus for manufacturing a display apparatus according to an exemplary embodiment of the present inventive concepts.

FIG. 6 is a cross-sectional view of the apparatus for manufacturing a display apparatus according to another exemplary embodiment of the present inventive concepts. In FIG. 6, for convenience of description, only the substrate 100, the mask assembly 310, the support member 320, the electrostatic chuck 330, the first driver 340, the connection member 345, the first plate 350, the second plate 360, and the second driver 370 are shown. In addition, in FIG. 6, the same reference numerals as those of FIG. 1 denote the same members, and thus, repeated descriptions of substantially identical elements are omitted for convenience of explanation.

Referring to FIG. 6, the mask frame 313 of the apparatus 300 for manufacturing a display apparatus according to an exemplary embodiment may include a first portion 313a and a second portion 313b. The first portion 313a has a first thickness t1 (e.g., length in the Z direction), and the second portion 313b may have a second thickness t2 (e.g., length in the Z direction) that is less than the first thickness a. The first portion 313a of the mask flame 313 may not overlap the electrostatic chuck 330 (e.g., in the Z direction), and the second portion 313b of the mask frame 313 may overlap at least a portion of the electrostatic chuck 330 in the Z direction), For example, as shown in the exemplary embodiment of FIG. 6, the second portion 313b may extend in the direction in a direction towards a center portion of the electrostatic chuck 330. The second portion 313b may be disposed on a bottom surface of the first portion 313a and the angle that the second portion 313b may extend from the first portion 313a is substantially perpendicular. However, exemplary embodiments of the present inventive concepts are limited thereto.

The substrate 100 may be prevented from being broken by reducing the thickness (e.g., length in the Z direction) of a portion of the mask frame 313 that overlaps the electrostatic chuck 330 and arranging the mask frame 313 to be spaced apart from the electrostatic chuck 330, and a process yield may be increased by more closely attaching the substrate 100 to the mask.

Figure 7:
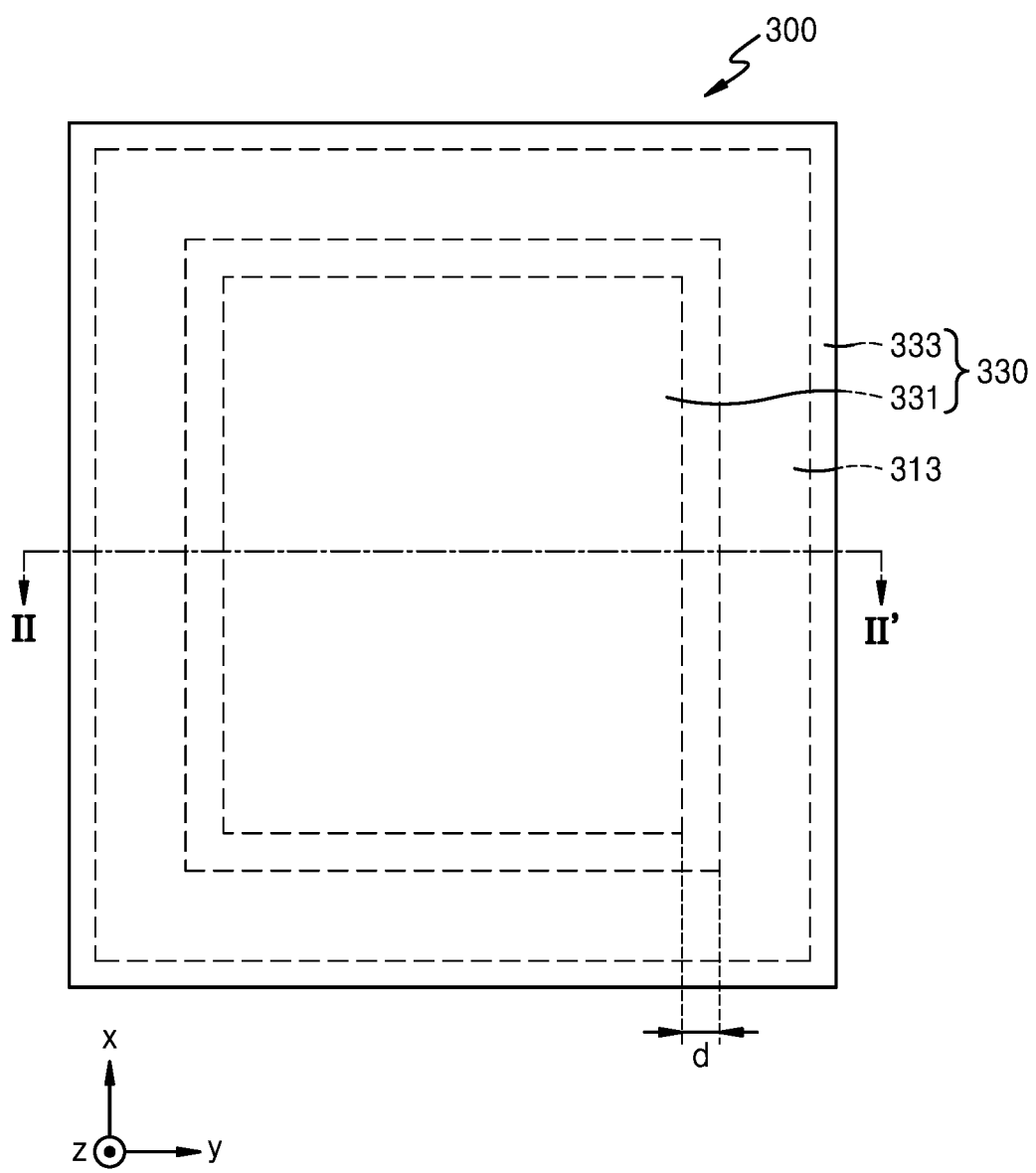
FIG. 7 is a plan view of an apparatus for manufacturing a display apparatus according to an embodiment.
Figure 8:
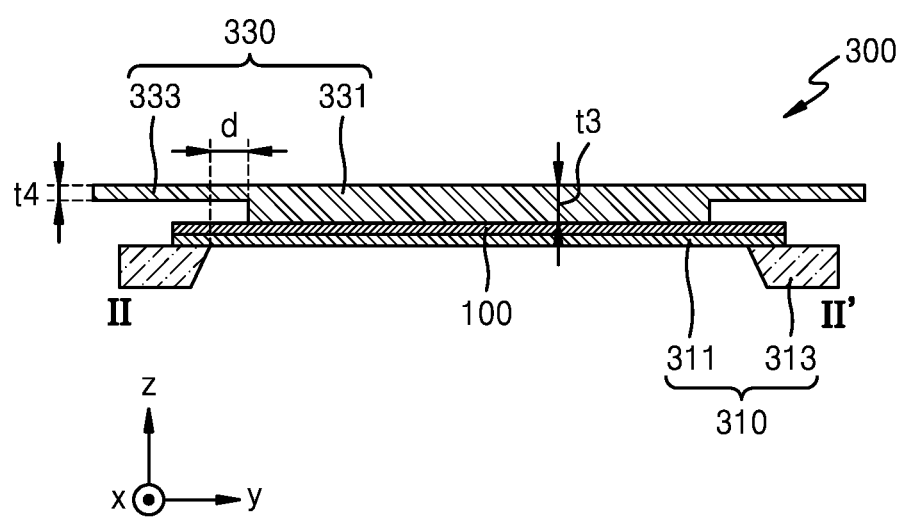
FIG. 8 is a cross-sectional view of an apparatus for manufacturing a display apparatus taken along line II-II' of FIG. 7 according to an exemplary embodiment of the present inventive concepts.

FIG. 7 is a plan view of the apparatus for manufacturing a display apparatus according to another exemplary embodiment of the present inventive concepts, and FIG. 8 is a cross-sectional view of the apparatus for manufacturing a display apparatus according to another exemplary embodiment of the present inventive concepts. The exemplary embodiments of FIGS. 7 and 8 are different from the above-described exemplary embodiments in that the electrostatic chuck includes a body portion 331 and a connection portion 333. The body portion 331 has a third thickness t3 (e.g., length in the Z direction), and the connection portion 333 has a fourth thickness t4 (e.g., length in the Z direction) that is less than the third thickness t3. Hereinafter, differences are mainly described. Other configurations are the same as or similar to the above-described exemplary embodiments and a description of substantially similar elements will be omitted for convenience of explanation.

The electrostatic chuck 330 of the apparatus 300 for manufacturing a display apparatus according to an exemplary embodiment may include the body portion 331 and the connection portion 333. The body portion 331 has the third thickness t3, and the connection portion 333 has the fourth thickness t4 that is less than the third thickness t3. The connection portion 333 of the electrostatic chuck 330 may surround at least a portion of the body portion 331.

In a plan view (e.g., in a plane defined in the X and directions), the inner end of the mask frame 313 may be spaced apart from the outer end of the body portion 331 of the electrostatic chuck 330 by a predetermined distance d. For example, inner lateral edges of the mask frame 313 (e.g., inner lateral edges in the X and directions) may be spaced apart from outer lateral edges of the mask frame (e.g., outer lateral edges in the X and Y directions). For example, the mask frame 313 may not overlap the body portion 331 of the electrostatic chuck 330 (e.g., in the Z direction).

However, the mask frame 313 may overlap at least a partial portion of the connection portion 333 of the electrostatic chuck 330 (e.g., in the Z direction). The thickness (e.g., length in the Z direction) of the connection portion 333 of the electrostatic chuck 330 which overlaps the mask frame 313 is reduced. Therefore, the mask frame 313 may be spaced apart from the connection portion 333 of the electrostatic chuck 330. For example, as shown in the exemplary embodiment of FIG. 8, the connection portion 333 may extend in the direction in a direction towards the outer edge of the mask frame 313. The connection portion 333 may be disposed on an upper surface of a lateral edge of the body portion 331 and the angle that the connection portion 333 may extend from the body portion 331 is substantially perpendicular. However, exemplary embodiments of the present inventive concepts are not limited thereto.

In an exemplary embodiment, the first driver 340 may be coupled to a lateral surface of the body portion 331 of the electrostatic chuck 330. In another exemplary embodiment, the first driver 340 may be coupled to the connection portion 333 of the electrostatic chuck 330.

Figure 9:
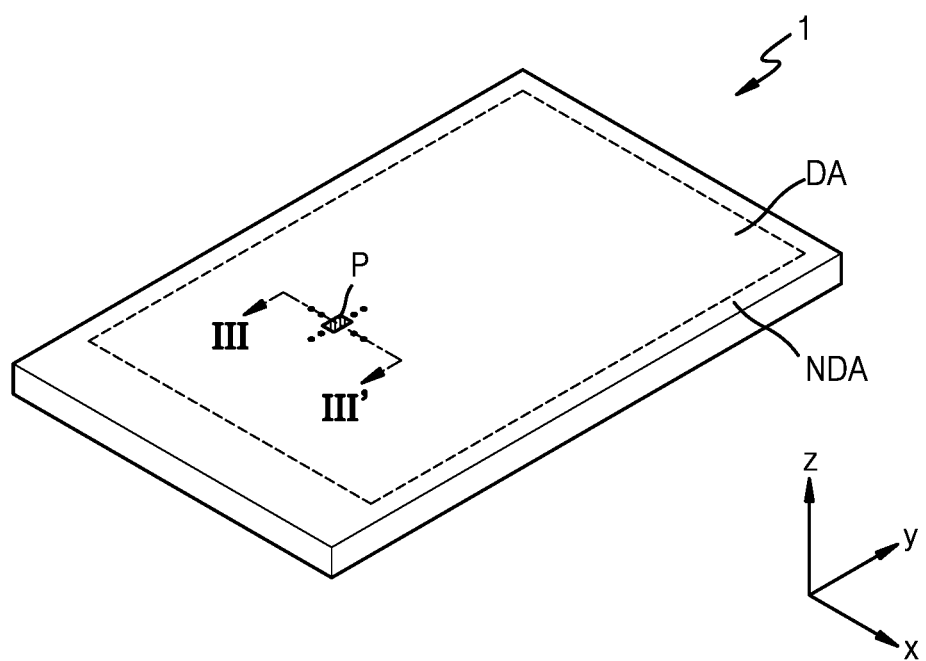
FIG. 9 is a perspective view of a display apparatus manufactured by an apparatus for manufacturing a display apparatus according to an exemplary embodiment of the present inventive concepts.
Figure 10:
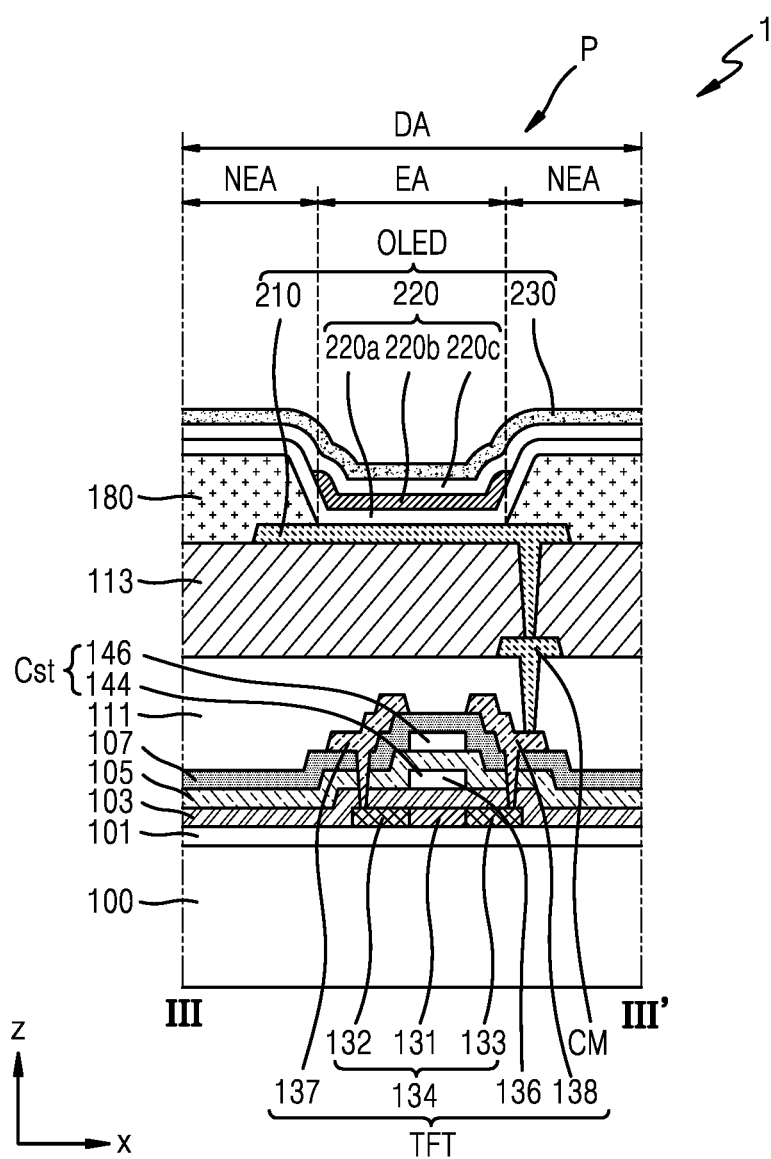
FIG. 10 is a cross-sectional view of a display apparatus manufactured by an apparatus for manufacturing a display apparatus taken along line III-III' of FIG. 9 according to an exemplary embodiment of the present inventive concepts.

FIG. 9 is a perspective view of the display apparatus manufactured by the apparatus for manufacturing a display apparatus according to an exemplary embodiment of the present inventive concepts, and FIG. 10 is a cross-sectional view of the display apparatus manufactured by the apparatus for manufacturing a display apparatus according to an exemplary embodiment of the present inventive concepts. FIG. 10 corresponds to a cross-sectional view of the display apparatus 1, taken along line III-III' of FIG. 9.

Referring to FIG. 9, the display apparatus 1 may include a display area DA and a non-display area NDA. The non-display area NDA may be arranged outside of the display area DA. The non-display area NDA may surround the display area DA. For example, as shown in the exemplary embodiment of FIG. 9, the non-display area NDA may completely surround the display area DA. However, exemplary embodiments of the present inventive concepts are not limited thereto and in other exemplary embodiments the display area DA may extend to at least one edge of the display apparatus 1 and the non-display area NDA may not be disposed on at least one side of the display area DA. The display apparatus 1 may display an image by using light emitted from a plurality of pixels P arranged in the display area DA. For convenience of illustration, FIG. 9 only shows a single pixel of the plurality of pixels P arranged in the display area DA. The non-display area NDA may include a region in which an image is not displayed.

Hereinafter, though an organic light-emitting display apparatus is described as the display apparatus 1 according to an embodiment as an example, exemplary embodiments of the present inventive concepts are not limited thereto. For example, in another exemplary embodiment, the display apparatus 1 may include display apparatuses such as inorganic light-emitting displays and quantum-dot light-emitting displays. As an example, an emission layer of a display element of the display apparatus 1 may include an organic material, an inorganic material, quantum dots, an organic material and an inorganic material, or an inorganic material and quantum dots.

Though FIG. 9 shows the display apparatus 1 including a flat display surface, exemplary embodiments of the present inventive concepts are not limited thereto. For example, in another exemplary embodiment, the display apparatus 1 may include a three-dimensional display surface or a curved display surface.

In an exemplary embodiment in which the display apparatus 1 includes a three-dimensional display surface, the display apparatus 1 may include a plurality of display areas indicating different directions, such as a polygonal column display surface. In an exemplary embodiment, in which the display apparatus 1 includes a curved display surface, the display apparatus 1 may include various shapes of display apparatus such as flexible, foldable, and roll able display apparatuses.

FIG. 9 shows the display apparatus 1 applied to mobile phone terminals. However, exemplary embodiments of the present inventive concepts are not limited thereto. For example, in other exemplary embodiments, the display apparatus 1 may be applied to other electronic devices such as not only large-scale electronic apparatuses such as televisions and monitors but also small and medium-scale electronic apparatuses such as tablet computers, automobile navigation apparatuses, game consoles, and smartwatches. However, exemplary embodiments of the present inventive concepts are not limited thereto. In an exemplary embodiment in which the display apparatus 1 is applied to a mobile phone terminal, the mobile phone terminal may also include electronic modules, a camera module, a power module, etc. which may be mounted on a mainboard and arranged in a bracket/case in cooperation with the display apparatus 2.

Though the display area. DA of the display apparatus 1 is quadrangular in the exemplary embodiment of FIG. 9, the shape of the display area DA may be circles, ellipses, or polygons such as triangles or pentagons in other exemplary embodiments. The display area DA may also have an irregular shape.

The display apparatus 1 includes a plurality of pixels P arranged in the display area DA. Each of the plurality of pixels P may include an organic light-emitting diode OLED. Each of the plurality of pixels P may emit, for example, red, green, blue, or white light from the organic light-emitting diode OLED. However, exemplary embodiments of the present inventive concepts are not limited thereto and each pixel of the plurality, of pixels P may emit various different colors of light. In the present specification, as described above, a pixel P may be understood as a pixel that emits red, green, blue, or white light.

Referring to the exemplary embodiment of FIG. 10, a display element may be arranged over the substrate 100. The display element may include a thin film transistor TFT and an organic light-emitting diode OLED.

In an exemplary embodiment, the substrate 100 may include glass or a polymer resin. The polymer resin may include at least one compound selected from polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 100 including the polymer resin may be flexible, rollable, or bendable. The substrate 100 may have a multilayer structure including a layer including the above-described polymer resin and an inorganic layer.

A buffer layer 101 may be disposed on the substrate 100. For example, as shown in the exemplary embodiment of FIG. 10, a lower surface of the buffer layer 101 may directly contact an upper surface of the substrate 100. The buffer layer 101 is disposed on the substrate 100 to reduce or block the penetration of foreign substances, moisture, or external air from below the substrate 100 and provide a flat surface on the substrate 100. In an exemplary embodiment, the buffer layer 101 may include an inorganic material such as oxide or nitride, an organic material, or an organic/inorganic composite material and have a single-layered structure or a multi-layered structure including an inorganic material and an organic material.

A thin film transistor TFT may be disposed on the buffer layer 101. As shown in the exemplary embodiment of FIG. 10, the thin film transistor TFT may include a semiconductor layer 134, a gate electrode 136, and a connection electrode. The gate electrode 136 overlaps the semiconductor layer 134 (e.g., in the Z direction), and the connection electrode is electrically connected to the semiconductor layer 134. The thin film transistor TFT may be connected to the organic light-emitting diode OLED to drive the organic light-emitting diode OLED.

The semiconductor layer 134 may be disposed on the buffer layer 101, For example, as shown in the exemplary embodiment of FIG. 10, a lower surface of the semiconductor layer 134 may directly contact an upper surface of the buffer layer 101. However, exemplary embodiments of the present inventive concepts are not limited thereto. The semiconductor layer 134 may include a channel region 131, a source region 132, and a drain region 133. The channel region 131 overlaps the gate electrode 136 e.g., in the Z direction), and the source region 132 and the drain region 133 are disposed on two opposite lateral sides of the channel region 131. (e.g., in the X direction). The source and drain regions 132, 133 include impurities having a higher concentration than the channel region 131. In an exemplary embodiment, the impurities may include N-type impurities or P-type impurities. The source region 132 and the drain region 133 may be electrically connected to a connection electrode.

In an exemplary embodiment, the semiconductor layer 134 may include an oxide semiconductor and/or a silicon semiconductor. In an exemplary embodiment in which the semiconductor layer 134 includes an oxide semiconductor, the semiconductor layer 134 may include an oxide that includes at least one compound selected from indium (In), gallium (Ga), stannum (Sn), zirconium (Zr), vanadium (V), hafnium (Hf), cadmium (Cd), germanium (Ge), chromium (Cr), titanium (Ti), and zinc (Zn). However, exemplary embodiments of the present inventive concepts are not limited thereto. For example, the semiconductor layer 134 may include InSnZnO (IO), InGaZnO (IGZO), etc. In the exemplary embodiment in which the semiconductor layer 134 includes a silicon semiconductor, the semiconductor layer 134 may include, for example, amorphous silicon (a-Si) or low temperature polycrystalline silicon (LIPS) formed by crystallizing amorphous silicon (a-Si). However, exemplary embodiments of the present inventive concepts are not limited thereto.

A first insulating layer 103 may be disposed on the semiconductor layer 134. For example, as shown in the exemplary embodiment of FIG. 10, a lower surface of the first insulating layer 103 may directly contact an upper surface of the semiconductor layer 134. However, exemplary embodiments of the present inventive concepts are not limited thereto. In an exemplary embodiment, the first insulating layer 103 may include an inorganic insulating material including at least one compound selected from silicon oxide ($SiO_2$), silicon nitride ($SiN_x$) silicon oxynitride (SiON), alumina oxide ($Al_2O_3$), titanium oxide ($TiO_x$), tantalum oxide ($Ta_2O_5$), hafnium oxide ($HafO_2$), and zinc oxide ($ZnO_2$). The first insulating layer 103 may include a single layer or a multi-layer including the above-mentioned inorganic insulating material.

The gate electrode 136 may be disposed on the first insulating layer 103. In are exemplary embodiment, the gate electrode 136 may include a single layer or a multi-layer including at least one compound selected from aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 136 may be connected to a gate line that applies an electric signal to the gate electrode 136.

A second insulating layer 105 may be disposed on the gate electrode 136. For example, as shown in the exemplary embodiment of FIG. 10, a lower surface of the second insulating layer 105 may directly contact an upper surface and lateral side surfaces of the gate electrode 136. In an exemplary embodiment, the second insulating layer 105 may include an inorganic insulating material including at least one compound selected from silicon oxide $SiO_2$), (silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The second insulating layer 105 may include a single layer or a multi-layer including the above-mentioned inorganic insulating material.

A storage capacitor Cst may be disposed on the first insulating layer 103, The storage capacitor Cst may include a bottom electrode 144 and a top electrode 146. The top electrode 146 overlaps the bottom electrode 144 (e.g., in the Z direction). The bottom electrode 144 and the top electrode 146 of the storage capacitor Cst may overlap each other with the second insulating layer 105 disposed therebetween (e.g., in the Z direction).

The bottom electrode 144 of the storage capacitor Cst may overlap the gate electrode 136 of the thin film transistor TFT (e.g., in the Z direction). In an exemplary embodiment, the bottom electrode 144 of the storage capacitor Cst and the gate electrode 136 of the thin film transistor TFT may be arranged as one body. However, exemplary embodiments of the present inventive concepts are not limited thereto. For example, in another exemplary embodiment, the capacitor Cst may not overlap the thin film transistor TFT (e.g., in the third direction DR3). Furthermore, in another exemplary embodiment, the bottom electrode 144 of the storage capacitor Cst may be a separate element independent of the gate electrode 136 of the thin film transistor TFT.

In an exemplary embodiment, the top electrode 146 of the storage capacitor ma include at least one compound selected from aluminum (Al) platinum (Pt), palladium (Pd), silver (Ag), magnesium (Mg), gold (Au), nickel (Ni), neodymium (Nd), (Ir), chrome (Cr), lithium (Li), calcium (Ca), molybdenum (Mo), titanium (Ti), tungsten (W), and copper (Cu) and include a single layer or a multi-layer including the above-mentioned materials.

A third insulating layer 107 may be disposed on the top electrode 146 of the storage capacitor Cst. For example, as shown in the exemplary embodiment of FIG. 10, a lower surface of the third insulating layer 107 may directly contact an upper surface of the second insulating layer 105 and an upper surface and lateral side surfaces of the top electrode 146. However, exemplary embodiments of the present inventive concepts are not limited thereto. In an exemplary embodiment, the third insulating layer 107 may include an inorganic insulating material including at least one compound selected from silicon oxide ($SiO_2$), silicon nitride ($SiN_x$), silicon oxynitride (SiON), aluminum oxide ($TiO_3$) titanium oxide ($TiO_2$), tantalum oxide ($Ta_2O_5$), hafnium oxide ($HfO_2$), and zinc oxide ($ZnO_2$). The third insulating layer 107 may include a single layer or a multi-layer including the above-mentioned inorganic insulating material.

A source electrode 137 and a drain electrode 138, which are connection electrodes, may be disposed on the third insulating layer 107. For example, as shown in the exemplary embodiment of FIG. 10, the source and drain electrodes 137, 138 may direct contact an upper surface of the third insulating layer 107. In an exemplary embodiment, the source electrode 137 and the drain electrode 138 may include a conductive material including at least one compound selected from molybdenum (Mo), aluminum (Al), copper (Cu), and titanium (Ti) and include a single layer or a n multi-layer including the above-mentioned materials. For example, the source electrode 137 and the drain electrode 138 may have a multi-layered structure of Ti/Al/Ti.

A first planarization layer 111 may be disposed on the source electrode 137 and the drain electrode 138. For example, as shown in the exemplary embodiment of FIG. 10, a lower surface of the first planarization layer 111 may directly contact the third insulating layer 107 and the source and drain electrodes 137, 138. The first planarization layer 111 may include a single layer or a multi-layer including an organic material or an inorganic material. In an exemplary embodiment, the first planarization layer 111 may include a general-purpose polymer such as benzocyclobutene (BCB), polyimide, hexamethyldisiloxane (HMDSO), polymethylmethacrylate (PMMA) and polystyrene (PS), polymer derivatives having a phenol-based group, an acryl-based polymer, can imide-based polymer, an aryl ether-based polymer, an amide-based polymer, a fluorine-based polymer, a p-xylene-based polymer, a vinyl alcohol-based polymer, or a blend thereof. In an exemplary embodiment, the first planarization layer 111 may include at least one compound selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). After the first planarization layer 111 is formed, chemical and mechanical polishing may be performed to provide a flat top surface.

A contact metal layer CM may be disposed on the first planarization layer 111. For example, as shown in the exemplary embodiment of FIG. 10, the contact metal layer CM may be disposed directly on the first planarization layer 111. However, exemplary embodiments of the present inventive concepts are not limited thereto. The contact metal layer CM may include at least one compound selected from aluminum (Al), copper (Cu), and titanium (Ti) and include a single layer or a multi-layer. For example, the contact metal layer CM may have a multi-layered structure of Ti/Al/Ti.

A second planarization layer 113 may be disposed on the contact metal layer CM. For example, as shown in the exemplary embodiment of FIG. 10, the second planarization layer 113 may be disposed directly on the contact metal layer CM. The second planarization layer 113 may include a single layer or a multi-layer including an organic material or an inorganic material. In an exemplary embodiment, the second planarization layer 113 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. In an exemplary embodiment, the second planarization layer 113 may include at least one compound selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$), After the second planarization layer 113 is formed, chemical and mechanical polishing may be performed to provide a flat top surface. However, exemplary embodiments of the present inventive concepts are not limited thereto. For example, in another exemplary embodiment, the second planarization layer 113 may be omitted.

An organic light-emitting diode OED may be disposed on the second planarization layer 113. For example, as shown in the exemplary embodiment of FIG. 10, a lower surface of the organic light-emitting diode OLED may be disposed directly on the second planarization layer 113. The organic light-emitting diode OLED may include a pixel electrode 210, an intermediate layer 220, and an opposite electrode 230. The pixel electrode 210 may be electrically connected to the contact metal layer CM through a contact bole passing through the second planarization layer 113. The contact metal layer CM may be electrically connected to the source electrode 137 and the drain electrode 138, which are the connection electrodes of the thin film transistor TFT, through contact holes passing through the first planarization layer 111. Accordingly, the organic light-emitting diode OLED may be electrically connected to the thin film transistor TFT.

The pixel electrode 210 may bee disposed on the second planarization layer 113, For example, as shown in the exemplary embodiment of FIG. 10, a lower surface of the pixel electrode 210 may be disposed an directly on upper surface of the second planarization layer 113. The pixel electrode 210 may include a (semi) transparent electrode or a reflective electrode. The pixel electrode 210 may include a reflective layer and a transparent or semi-transparent electrode layer disposed on the reflective layer. In an exemplary embodiment, the reflective layer includes at least one compound selected from aluminum (Al), platinum (Pt), palladium (Pd), silver (Ag), magnesium (Mg), gold (Au), nickel (Ni), neodymium (Nd), iridium (chrome (Cr), lithium (Li), calcium (Ca), molybdenum (Mo), titanium (Ti), tungsten (W), and copper (Cu), and a compound thereof. The transparent or semi-transparent electrode layer may include at least one compound selected from indium tin oxide (ITO), indium zinc oxide (IZO), zinc oxide (ZnO), indium oxide ($In_2O_3$), indium gallium oxide (IGO), and aluminum zinc oxide (AZO). For example, the pixel electrode 210 may have a stack structure of ITO/Ag/ITO.

A pixel-defining layer 180 may be disposed on the second planarization layer 113 and may have an opening that exposes at least a portion of the pixel electrode 210. For example, as shown in the exemplary embodiment of FIG. 10, a lower surface of the pixel-defining layer 180 may directly contact upper and lateral sides surfaces of the pixel electrode 210. A region of the pixel electrode 210 that is exposed through the opening of the pixel-defining layer 180 may be defined as an emission area EA. A non-emission area NEA may overlap the pixel-defining layer 180 (e.g., in the Z direction) and may surround the emission areas EA. For example, the display area DA may include a plurality of emission areas EA and the non-emission area NEA may surrounding the emission areas EA. The pixel-defining layer 180 may prevent an arc, etc. from occurring at the lateral edges of the pixel electrode 210 by increasing a distance between the pixel electrode 210 and the opposite electrode 230. In an exemplary embodiment, the pixel-defining layer 180 may include an organic insulating material, such as at least one compound selected from polyimide, polyamide, an acrylic resin, HMDO, and a phenolic resin and may be formed through spin coating, etc. However, exemplary embodiments of the present inventive concepts are not limited thereto.

An intermediate layer 220 may be disposed on a portion of the pixel electrode 210 that is exposed by the pixel-defining layer ISO. The intermediate layer 220 may include an emission layer 220b and may selectively include a first functional layer 220a disposed under the emission layer 220b and/or a second functional layer 220c disposed above the emission layer 2201. However, exemplary embodiments of the present inventive concepts are not limited thereto.

In an exemplary embodiment, the intermediate layer 220 may be formed on a portion of the pixel electrode 210 that is exposed by the pixel-defining layer 180 by using the apparatus 300 of manufacturing a display apparatus described above (see, e.g., FIG. 1). For example, in an exemplary embodiment, the emission layer 220b of the intermediate layer 220 may be formed on a portion of the pixel electrode 210 that is exposed by the pixel-defining layer 180 by using the apparatus 300 of manufacturing a display apparatus (see FIG. 1) described above.

In an exemplary embodiment, the first functional layer 220a may include a hole injection layer (HIL) and/or a hole transport layer (HTL). The second functional layer 220c n a include an electron transport layer (ETL) and/or an electron injection layer (EIL). However, exemplary embodiments of the present inventive concepts are Rot limited thereto.

In an exemplary embodiment, the emission layer 220b may include an organic material including a fluorescent or phosphorous material that emits red, green, blue, or white light. The emission layer 220b may include a low molecular weight organic material or a polymer organic material. However, exemplary embodiments of the present inventive concepts are not limited thereto.

In an exemplary embodiment in which the emission layer 220b includes a low molecular weight organic material, the intermediate layer 220 may have a structure in which an HIL, an HTL, EML, an ETL, an EIL, etc. are stacked in a single or composite configuration. The intermediate layer 220 may include, as a low molecular weight organic material, various organic materials such as at least one compound selected from copper phthalocyanine (CuPc), N, N'-Di (naphthalene-1-yl)-N, N-diphenyl-benzidine (NPB), and tris-8-hydroxyquinoline aluminum ($Alq_3$). These layers may be formed through vacuum deposition. However, exemplary embodiments of the present inventive concepts are not limited thereto.

In an exemplary embodiment in which the emission layer 220b includes a polymer organic material, the intermediate layer 220 may generally have a structure including a hole transport layer and the emission layer 220b. In this exemplary embodiment, the HTL may include poly (3,4-ethylenedioxythiophene) (PEDOT), and the emission layer 220b may include a polymer material such as a polyphenylene vinylene (PPV)-based material and a polyfluorene-based material in an exemplary embodiment, the emission layer

220b may be formed through screen printing or inkjet printing, and laser induced thermal imaging (LITI).

The opposite electrode 230 may be disposed on the intermediate layer 220. For example, as shown in the exemplary embodiment of FIG. 10, the opposite electrode 230 may be disposed directly on the intermediate layer 220. The opposite electrode 230 may be disposed on the intermediate layer 220 and arranged to entirely cover the intermediate layer 220. The opposite electrode 230 may be arranged over the display area DA and arranged to entirely cover the display area DA. For example, the opposite electrode 230 may be formed as one body over the entire display panel to cover a plurality of pixels P arranged in the display area DA by using an open mask.

The opposite electrode 230 may include a conductive material having a low work function. As an example, the opposite electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 230 may further include a layer on the (semi) transparent layer including the above-mentioned material, the layer including ITO, IZO, ZnO, or $In_2O_3$.

In a comparative embodiment in which the electrostatic chuck overlaps the mask frame (e.g., in the Z direction), when the substrate is closely attached to the mask, the flatness of the substrate may be distorted and the substrate may be broken.

According to an exemplary embodiment, since a space is provided between the outer lateral surface of the electrostatic chuck and the mask frame, even though the flatness may be partially distorted, the substrate may be prevented from being broken. For example, an apparatus for manufacturing a display apparatus that is insensitive to flatness may be provided.

According to an exemplary embodiment having the above configuration, an apparatus for manufacturing a display apparatus may be provided in which the substrate may be prevented from being broken by reducing an area in which the electrostatic chuck overlaps the mask frame, and simultaneously, a process yield may be increased by more closely attaching the substrate to the mask. However, exemplary embodiments of the present inventive concepts are not limited to these aspects.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments. While one or more exemplary embodiments have been described with reference to the futures, it will be understood by those of ordinary skill in the art that various changes in form and details may be made therein without departing from the spirit and scope as defined by the following claims.

What is claimed is:

1. An apparatus for manufacturing a display apparatus, the apparatus comprising:
a substrate;
a mask assembly including an opening, a mask frame surrounding the opening, and at least one mask coupled to the mask frame, the mask frame supporting the at least one mask;
an electrostatic chuck generating an electrostatic force to attach the substrate to the mask; and
a first driver driving the electrostatic chuck,
wherein the electrostatic chuck includes:
a body portion that does not overlap the mask frame in a thickness direction of the substrate and has a first thickness; and
a connection portion at least partially overlaps the mask frame and the substrate in the thickness direction of the substrate, an entirety of the connection portion has a second thickness that is less than the first thickness and an inner end of the connection portion and an outer end of the body portion are integral with each other, wherein a portion of the connection portion that overlaps the substrate is spaced apart from the substrate in the thickness direction of the substrate by an amount equal to a difference between the first thickness and the second thickness;
wherein an inner end of the mask frame is spaced apart from the outer end of the body portion of the electrostatic chuck in a cross-sectional view,
wherein an empty space is defined between the inner end of the mask frame and the outer end of the body portion of the electrostatic chuck in the cross-sectional view,
wherein the mask frame and the substrate are at least partially overlapped in the cross-sectional view, and
wherein an outermost end of the connection portion is disposed more outwardly than an outermost end of the mask frame.

2. The apparatus of claim 1, wherein the connection portion at least partially surrounds the body portion.

3. The apparatus of claim 1, wherein the first driver is coupled to a lateral surface of the electrostatic chuck.

4. The apparatus of claim 1, wherein the first driver moves the electrostatic chuck upward or downward.

5. The apparatus of claim 1, further comprising a first plate attaching the substrate to the at least one mask by application of magnetic force.

6. The apparatus of claim 5, wherein the electrostatic chuck and the first plate are driven independently from each other.

7. The apparatus of claim 6, further comprising a second driver driving the first plate,
wherein the second driver moves the first plate upward or downward.

8. An apparatus for manufacturing a display apparatus, the apparatus comprising:
a substrate;
a mask assembly including an opening, a mask frame surrounding the opening, and at least one mask coupled to the mask frame, the mask frame supporting the at least one mask; and
an electrostatic chuck generating an electrostatic force to attach the substrate to the mask, the electrostatic chuck including a first portion overlapping the opening in a thickness direction of the substrate to increase an adhesive force attaching the substrate to the at least one mask and a second portion overlapping the mask frame in the thickness direction of the substrate and at least partially overlapping the substrate in the thickness direction of the substrate, wherein an outer end of the first portion and an inner end of the second portion are integral with each other,
wherein an entirety of the second portion of the electrostatic chuck has a second thickness that is less than a first thickness of the first portion of the electrostatic chuck, wherein a portion of the second portion that overlaps the substrate is spaced apart from the substrate in the thickness direction of the substrate by an amount equal to a difference between the first thickness and the second thickness;

wherein an inner end of the mask frame is spaced apart from the outer end of the first portion of the electrostatic chuck in a cross-sectional view, wherein an empty space is defined between the inner end of the mask frame and the outer end of the first portion of the electrostatic chuck in the cross-sectional view, wherein the mask frame and the substrate are at least partially overlapped in the cross-sectional view, and wherein an outermost end of the second portion is disposed more outwardly than an outermost end of the mask frame.

* * * * *